(12) United States Patent
Wang et al.

(10) Patent No.: US 8,829,652 B2
(45) Date of Patent: Sep. 9, 2014

(54) LIGHT EMITTING DEVICE WITH GRADED COMPOSITION HOLE TUNNELING LAYER

(75) Inventors: Chao-Hsun Wang, Zhongli (TW); Hao-Chung Kuo, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/551,068

(22) Filed: Jul. 17, 2012

(65) Prior Publication Data
US 2013/0228806 A1    Sep. 5, 2013

(30) Foreign Application Priority Data

Mar. 2, 2012  (TW) .............................. 101106873 A

(51) Int. Cl.
*H01L 33/00* (2010.01)
*H01L 29/06* (2006.01)

(52) U.S. Cl.
USPC ........ 257/615; 257/13; 257/76; 257/E33.008; 257/E33.026; 257/E33.028; 977/759; 977/950; 977/951; 438/502; 438/45; 438/46; 438/47

(58) Field of Classification Search
CPC ... H01L 33/00; H01L 33/007; H01L 33/0075; H01L 33/0079; H01L 33/04; H01L 33/06; H01L 33/08; H01L 33/32; H01L 33/12; H01L 33/16; H01L 33/22; H01L 33/40; H01L 33/405; H01L 29/8616; H01L 29/406; H01L 29/2003; H01L 29/7787; H01L 29/66462; H01L 29/432; H01L 29/4176; H01L 21/0237; H01L 21/0251; H01L 21/02458; H01L 21/02488; H01L 21/02502; H01L 21/0254; H01L 21/02491; H01L 21/02614; H01L 2251/5346; C30B 29/406

USPC ............ 257/94, 13, 43, 76, 98, 99, 102, 192, 257/607, 615, E33.008, E33.023, E33.028, 257/E33.066, E33.069, E33.026, E21.09; 977/759, 950, 951; 438/478, 22, 24, 438/45–47

See application file for complete search history.

(56) References Cited

U.S. PATENT DOCUMENTS

| | | | |
|---|---|---|---|
| 6,955,933 B2 * | 10/2005 | Bour et al. ...................... | 438/22 |
| 2010/0120234 A1 * | 5/2010 | Yao et al. ....................... | 438/478 |
| 2011/0012089 A1 * | 1/2011 | Khan et al. ..................... | 257/13 |

OTHER PUBLICATIONS

Wang_et_al_Hole Injection efficiency improvement in InGaN-GaN LED by band engineered electron blocking layer, API-97-261103-2010 p. 261103-1-3.pdf.*
C.H. Wang, et al, "Hole transport improvement in InGaN/GaN light-emitting diodes by graded-composition multiple quantum barriers" AIP Applied Physics Letters, 99, 171106 (2011).

* cited by examiner

*Primary Examiner* — W. Wendy Kuo
*Assistant Examiner* — Moazzam Houssain
(74) *Attorney, Agent, or Firm* — Bacon & Thomas, PLLC

(57) ABSTRACT

A light emitting device with graded composition hole tunneling layer is provided. The device comprises a substrate and an n-type semiconductor layer is disposed on the substrate, in which the n-type semiconductor layer comprises a first portion and a second portion. A graded composition hole tunneling layer is disposed on the first portion of the n-type semiconductor layer. An electron blocking layer is disposed on the graded composition hole tunneling layer. A p-type semiconductor layer is disposed on the electron blocking layer. A first electrode is disposed on the p-type semiconductor layer, and a second electrode is disposed on the second portion of the n-type semiconductor layer and is electrical insulated from the first portion of the n-type semiconductor. The graded composition hole tunneling layer is used as the quantum-well to improve the transport efficiency of the holes to increase the light emitting efficiency of the light emitting device.

1 Claim, 4 Drawing Sheets

LIGHT EMITTING DEVICE WITH GRADED COMPOSITION HOLE TUNNELING LAYER

BACKGROUND OF THE INVENTION

1. Field of the Invention

The present invention relates a light emitting device, more particularly to a light emitting device with graded composition hole tunneling layer.

2. Description of the Prior Art

In the prior art structure, most wide band gap semiconductor light emitting devices (particularly Group III and Group V nitride) contain the quantum-well as the light emitting layer. The quantum barrier provides the ability for confining the carrier in the light emitting layer. However, due to the internal electric field will be generated upon operating Group III nitride semiconductor devices, the electrons and holes will be hindered by the declined quantum barrier. The transport of electrons and holes in the quantum-well will be blocked, so that the light emitting efficiency will be reduced.

Employing the quantum-well as the light emitting layer has become a very common application of the semiconductor light emitting device, such as the laser diode and the light emitting diode. It has been mentioned in the prior art that the electron hole distribution of common indium gallium nitride/gallium nitride quantum-well is extremely concentrated in the last quantum-well, which is not advantageous for the operation at high current. It has also been mentioned in the other prior art that the problem of concentrated electrons and holes can be improved by using thin quantum barrier and changing doping concentration, but the efficacy is quite limited. The graded quantum barrier height is adopted to change the carrier transport, but only electron overflow is reduced by this way, the problem of electron hole transport still cannot be improved.

SUMMARY OF THE INVENTION

According to the drawback of the prior art, the present invention provides a light emitting device with graded composition hole tunneling layer. The graded composition hole tunneling layer is used to change the band gap of quantum-well barrier, and reduce the valence energy barrier at that place, to improve the transport of holes in quantum-well and increase the light emitting efficiency of the light emitting device.

Another propose of the present invention is to provide a graded composition hole tunneling layer in the light emitting device, which is used as the quantum-well to improve the transport of the carrier in the quantum-well and the composite light emitting efficiency.

One of other proposes of the present invention is to provide a graded composition hole tunneling layer in the light emitting device, which is used as the quantum-well to solve the reduced carrier transport phenomenon due to in-built electric field in the conventional light emitting device, and improve the transport difference of electron hole and increase the light emitting efficiency.

One of other proposes of the present invention is to provide a graded composition hole tunneling layer in the light emitting device, which is used as the quantum-well to block electron overflow to reduce the valence energy barrier, so that the electron holes can transport easier in the quantum-well and light with the electron together.

According to the above-mentioned purposes, the present invention provides a light emitting device with graded composition hole tunneling layer. The device comprises a substrate and an n-type semiconductor layer is disposed on the substrate, in which the n-type semiconductor layer comprises a first portion and a second portion. A graded composition hole tunneling layer is disposed on the first portion of the n-type semiconductor layer. An electron blocking layer is disposed on the graded composition hole tunneling layer. A p-type semiconductor layer is disposed on the electron blocking layer. A first electrode is disposed on the p-type semiconductor layer, and a second electrode is disposed on the second portion of the n-type semiconductor layer and is electrical insulated from the first portion of the n-type semiconductor. The charge of the second electrode and the first electrode is opposite.

In an embodiment of the present invention, the above-mentioned substrate is the sapphire, silicon carbide (SiC), zinc oxide (ZnO), silicon, gallium nitride (GaN), spinel ($MgAl_2O_4$), aluminum nitride (AlN), gallium arsenide (GaAs), gallium phosphide (GaP), germanium (Ge), zinc oxide (ZnO), magnesium oxide (MgO), lithium aluminate (LAO, $LiAlO_2$), lithium gallate (LGO, $LiGaO_2$) and glass material.

In an embodiment of the present invention, the above-mentioned graded composition hole tunneling layer possesses multiple pairs of indium gallium nitride (InGaN)/indium gallium aluminum nitride ($Al_xIn_yGa_{1-x-y}N$), wherein $0 \le x \le 0.5$, $0 \le y \le 0.5$, and the x and y are gradually increased or gradually decreased in indium gallium aluminum nitride ($Al_xIn_yGa_{1-x-y}N$) for at least a pair of indium gallium nitride (InGaN)/indium gallium aluminum nitride ($Al_xIn_yGa_{1-x-y}N$).

In an embodiment of the present invention, the content of aluminum and the content of indium in indium gallium nitride (InGaN)/indium gallium aluminum nitride ($Al_xIn_yGa_{1-x-y}N$) of the above-mentioned graded composition hole tunneling layer are partially changed or totally changed.

In an embodiment of the present invention, the above-mentioned graded composition hole tunneling layer is n-type doping hole tunneling layer or un-doping hole tunneling layer.

In an embodiment of the present invention, the thickness of the above-mentioned graded composition hole tunneling layer is 3 nm to 15 nm.

In an embodiment of the present invention, the energy blocking layer of the above-mentioned graded composition hole tunneling layer is increased gradually from n-type semiconductor layer to p-type semiconductor layer.

In an embodiment of the present invention, the above-mentioned electron blocking layer is indium gallium aluminum nitride ($Al_xIn_yGa_{1-x-y}N$) containing layer, wherein $0 \le x \le 0.5$, $0 \le y \le 0.5$.

The present invention also provides a light emitting device with graded composition hole tunneling layer. The device comprises a substrate and a first electrode that is disposed on the substrate. A p-type semiconductor layer is disposed on the first electrode. An electron blocking layer is disposed on the p-type semiconductor layer. A graded composition hole tunneling layer is disposed on the electron blocking layer. An n-type semiconductor layer is disposed on the graded composition hole tunneling layer. A second electrode is disposed on the n-type semiconductor layer. The charge of the second electrode and the first electrode is opposite.

In an embodiment of the present invention, the above-mentioned substrate is the sapphire, silicon carbide (SiC), zinc oxide (ZnO), silicon, gallium nitride (GaN), spinel ($MgAl_2O_4$), aluminum nitride (AlN), gallium arsenide (GaAs), gallium phosphide (GaP), germanium (Ge), zinc oxide (ZnO), magnesium oxide (MgO), lithium aluminate (LAO, LiAlO$_2$), lithium gallate (LGO, LiGaO$_2$) and glass material.

In an embodiment of the present invention, the above-mentioned electron blocking layer is indium gallium aluminum nitride (Al$_x$In$_y$Ga$_{1-x-y}$N) containing layer, wherein 0≤x≤0.5, 0≤y≤0.5.

In an embodiment of the present invention, the above-mentioned graded composition hole tunneling layer possesses multiple pairs of indium gallium nitride (InGaN)/indium gallium aluminum nitride (Al$_x$In$_y$Ga$_{1-x-y}$N), wherein 0≤x≤0.5, 0≤y≤0.5, and the x and y are gradually increased or gradually decreased in indium gallium aluminum nitride (Al$_x$In$_y$Ga$_{1-x-y}$N) for at least a pair of indium gallium nitride (InGaN)/indium gallium aluminum nitride (Al$_x$In$_y$Ga$_{1-x-y}$N).

In an embodiment of the present invention, the content of aluminum and the content of indium in indium gallium nitride (InGaN)/indium gallium aluminum nitride (Al$_x$In$_y$Ga$_{1-x-y}$N) of the above-mentioned graded composition hole tunneling layer are partially changed or totally changed.

In an embodiment of the present invention, the above-mentioned graded composition hole tunneling layer is n-type doping hole tunneling layer or un-doping hole tunneling layer.

In an embodiment of the present invention, the thickness of the above-mentioned graded composition hole tunneling layer is 3 nm to 15 nm.

In an embodiment of the present invention, the energy blocking layer of the above-mentioned is increased gradually from n-type semiconductor layer to p-type semiconductor layer.

Therefore, the advantage and spirit of the present invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention discusses a semiconductor light emitting device. In order to understand the present invention thoroughly, the structure and manufacturing steps of semiconductor light emitting device will be described in detail as follows. Obviously, the implement of the present invention will not limit the special details of semiconductor light emitting device. However, besides describing in detail, the present invention can also be widely implemented in other embodiments, and the range of the invention is not limited, it is subject to the claims and future patent range.

Figure 1:
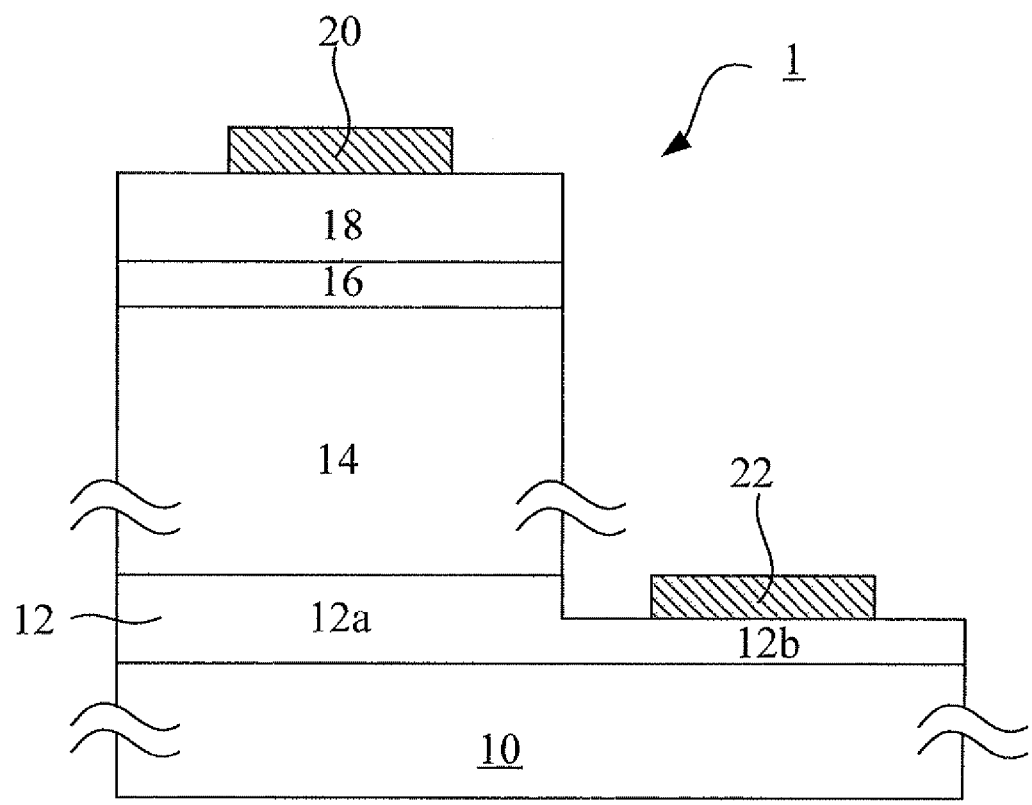
FIG. 1 is an illustration for an embodiment of a light emitting device with graded composition hole tunneling layer.

Please referring to FIG. 1, which is an illustration for an embodiment of a light emitting device with graded composition hole tunneling layer. As shown in FIG. 1, the light emitting device 1 with graded composition hole tunneling layer comprises a substrate 10, an n-type semiconductor layer 12, a graded composition hole tunneling layer 14, an electron blocking layer 16 and a p-type semiconductor layer 18. Wherein, the n-type semiconductor layer 12 is disposed on the substrate 10, in which the n-type semiconductor layer comprises a first portion and a second portion. The graded composition hole tunneling layer 12 is disposed on the first portion 12a of the n-type semiconductor layer 12. The electron blocking layer 16 is disposed on the graded composition hole tunneling layer 14. The p-type semiconductor layer 18 is disposed on the electron blocking layer 16. The light emitting device 1 with graded composition hole tunneling layer also comprises a first electrode 20, which is disposed on the p-type semiconductor layer 18, and a second electrode 22, which is disposed on the second portion 12b of the n-type semiconductor layer 12. The charge of the second electrode 22 and the first electrode 20 is opposite.

Figure 2:
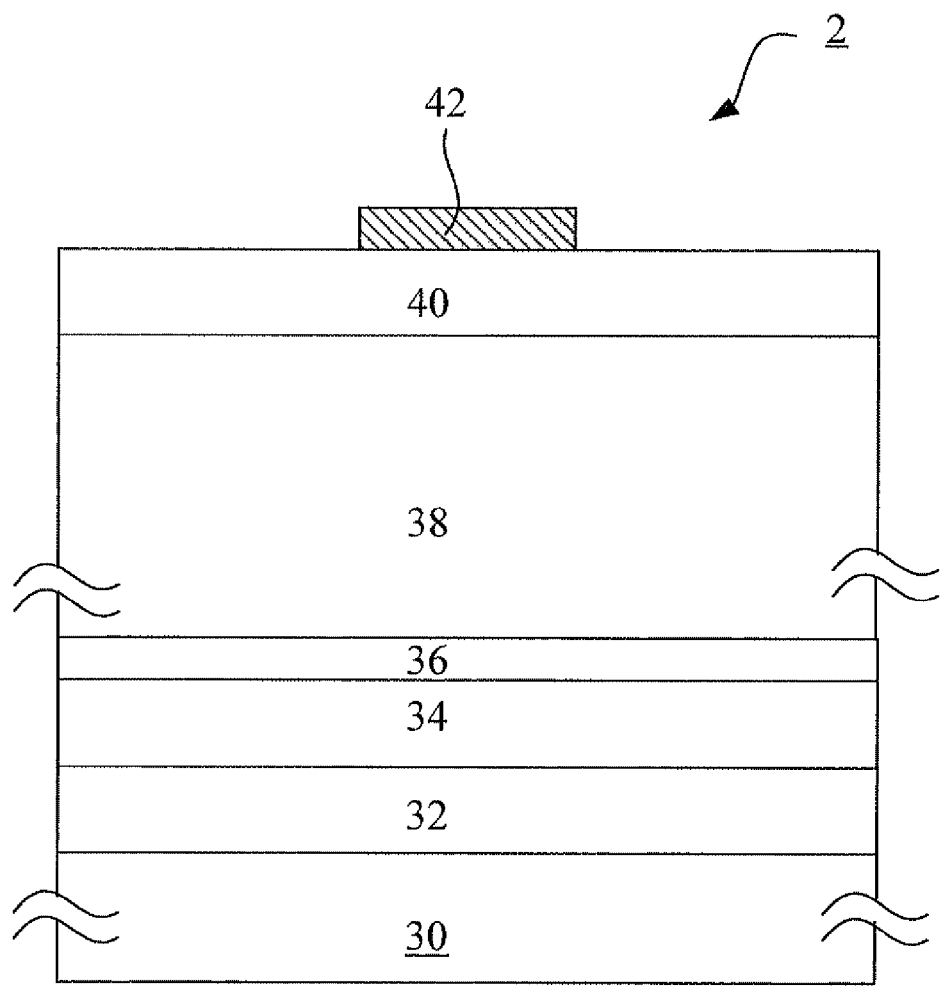
FIG. 2 is an illustration for another embodiment of a light emitting device with graded composition hole tunneling layer.

Please referring to FIG. 2, which is an illustration for another embodiment of a light emitting device with graded composition hole tunneling layer. As shown in FIG. 2, the light emitting device 2 with graded composition hole tunneling layer comprises a substrate 30, a first electrode 32, a p-type semiconductor layer 34, an electron blocking layer 36, a graded composition hole tunneling layer 38, an n-type semiconductor layer 40 and a second electrode 42. Wherein, the first electrode 32 is disposed on the substrate 30. The p-type semiconductor layer 34 is disposed on the first electrode 32. The electron blocking layer 36 is disposed on the p-type semiconductor layer 34. The graded composition hole tunneling layer 38 is disposed on the electron blocking layer 36. The n-type semiconductor layer 40 is disposed on the graded composition hole tunneling layer 38. The second electrode 42 is disposed on the n-type semiconductor layer 40. The charge of the second electrode 42 and the first electrode 32 is opposite.

In the embodiment of the present invention, the light emitting device shown in FIG. 1 and FIG. 2 may be the light emitting diode, the semiconductor laser or the laser diode.

In the structure of the light emitting device with graded composition hole tunneling layer shown in FIG. 1 and FIG. 2, the material of the substrate 10, 30 may be the sapphire, spinel (MgAl$_2$O$_4$), gallium nitride (GaN), aluminum nitride (AlN), silicon carbide (SiC), gallium arsenide (GaAs), gallium phosphide (GaP), silicon (Si), germanium (Ge), zinc oxide (ZnO), magnesium oxide (MgO), lithium aluminate (LAO, LiAlO$_2$), lithium gallate (LGO, LiGaO$_2$) and glass material. The n-type semiconductor layer 12, 40 is n-type GaN containing semiconductor layer and the p-type semiconductor layer 18, 34 is p-type GaN containing semiconductor layer.

In addition, according to the above-mentioned structure, the forming method for the semiconductor light emitting device disclosed in the present invention is the epitaxially grow method, such as the Metal-Organic Chemical Vapor Deposition (MOCVD) or the Hydride Vapor Phase Epitaxy (HVPE) or the Molecular Beam Epitaxy (MBE) or the Hot Wall Epitaxy.

In an embodiment of the present invention, the graded composition hole tunneling layer 14, 38 possesses multiple pairs of indium gallium nitride (InGaN)/indium, gallium aluminum nitride (Al$_x$In$_y$Ga$_{1-x-y}$N) with 3 nm to 15 nm thick, wherein 0≤x≤0.5, 0≤y≤0.5. The composition of indium gallium aluminum nitride is changed through the change for the content of aluminum, indium and gallium, and the content of gallium is changed with respect to the content of aluminum and the content of indium. It has to describe that because the graded composition hole tunneling layer 14, 38 is consisted of multiple pairs of indium gallium nitride (InGaN)/indium gallium aluminum nitride ($Al_xIn_yGa_{1-x-y}N$), the content of aluminum (Al), indium (In) and gallium (Ga) is different for every pair of indium gallium nitride (InGaN)/indium gallium aluminum nitride ($Al_xIn_yGa_{1-x-y}N$) in the graded composition hole tunneling layer 14, 38. The change of content may be gradually increased (or decreased) from bottom layer to upper layer, or gradually increased (or decreased) from upper layer to bottom layer.

In an embodiment, the content of aluminum (Al) in the indium gallium aluminum nitride ($Al_xIn_yGa_{1-x-y}N$) is changed from 0 to 0.5. Thus, the content of aluminum can be gradually increased from the bottom layer of the graded composition hole tunneling layer 14, 38 until the content of aluminum is 0.5 in the top layer of the graded composition hole tunneling layer 14, 38.

In another embodiment, the content of aluminum can be gradually increased from the upper layer of the graded composition hole tunneling layer 14, 38 until the content of aluminum is 0.5 in the lowest layer of the graded composition hole tunneling layer 14, 38. Similarly, the content of indium in the indium gallium aluminum nitride ($Al_xIn_yGa_{1-x-y}N$) may also be changed from 0 to 0.5. The content of indium can be gradually increased from the upper layer of the graded composition hole tunneling layer 14, 38 until the content of indium is 0.5 in the lowest layer of the graded composition hole tunneling layer 14, 38.

In another embodiment, the content of indium can be gradually increased from the upper layer of the graded composition hole tunneling layer 14, 38 until the content of aluminum is 0.5 in the lowest layer of the graded composition hole tunneling layer 14, 38.

Thus, in the above-mentioned embodiments, the content of aluminum and the content of indium in the multiple pairs of indium gallium nitride (InGaN)/indium gallium aluminum nitride ($Al_xIn_yGa_{1-x-y}N$) are gradually changed totally (i.e. increased totally or decreased totally) to form the graded composition hole tunneling layer 14, 38.

In another embodiment, the content of aluminum and the content of indium in the multiple pairs of indium gallium nitride (InGaN)/indium gallium aluminum nitride ($Al_xIn_yGa_{1-x-y}N$) can be gradually changed partially (i.e. increased partially or decreased partially) to form the graded composition hole tunneling layer 14, 38. In another embodiment, in the multiple pairs of indium gallium nitride (InGaN)/indium gallium aluminum nitride ($Al_xIn_yGa_{1-x-y}N$) forming the graded composition hole tunneling layer 14, 38, only the content of aluminum and the content of indium in at least a pair of indium gallium nitride (InGaN)/indium gallium aluminum nitride ($Al_xIn_yGa_{1-x-y}N$) has the gradually change type, it also can form the graded composition hole tunneling layer 14, 38. In addition, in the above-mentioned embodiments, the graded composition hole tunneling layer 14, 38 with partial change or total change may be n-type doping or un-doping graded composition hole tunneling layer 14, 38.

Figure 3:
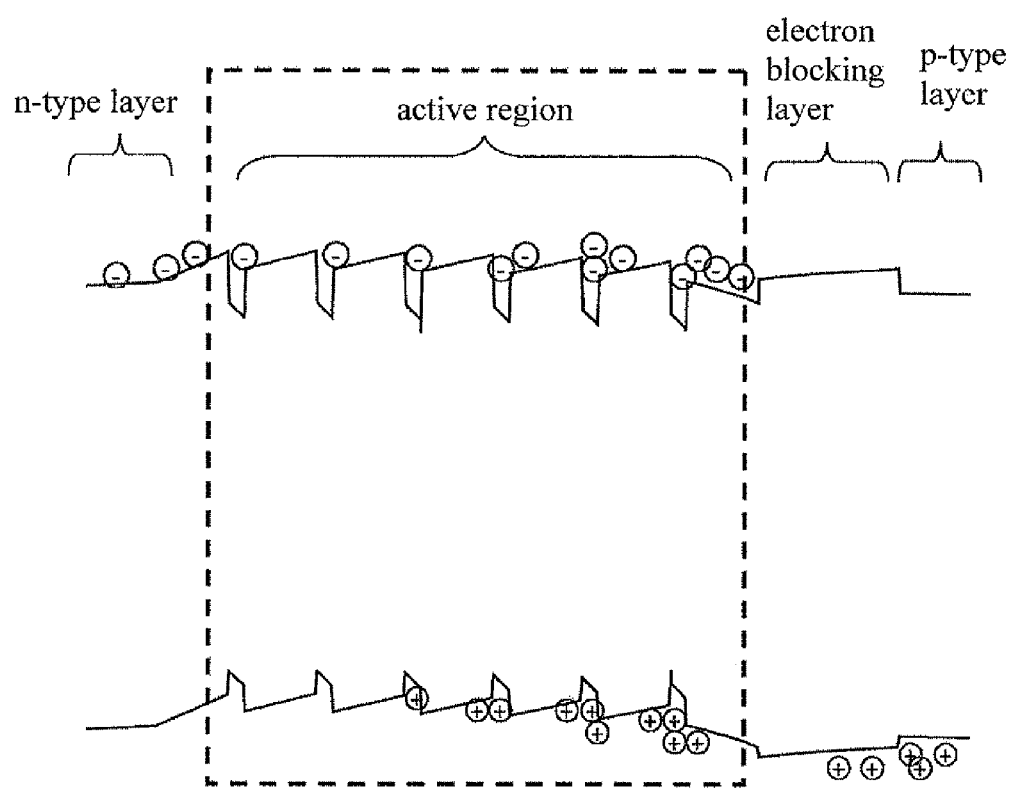
FIG. 3 is a diagram illustrating the band gap of conventional wide band gap semiconductor light emitting device and its influence on the behavior of carrier.
Figure 4:
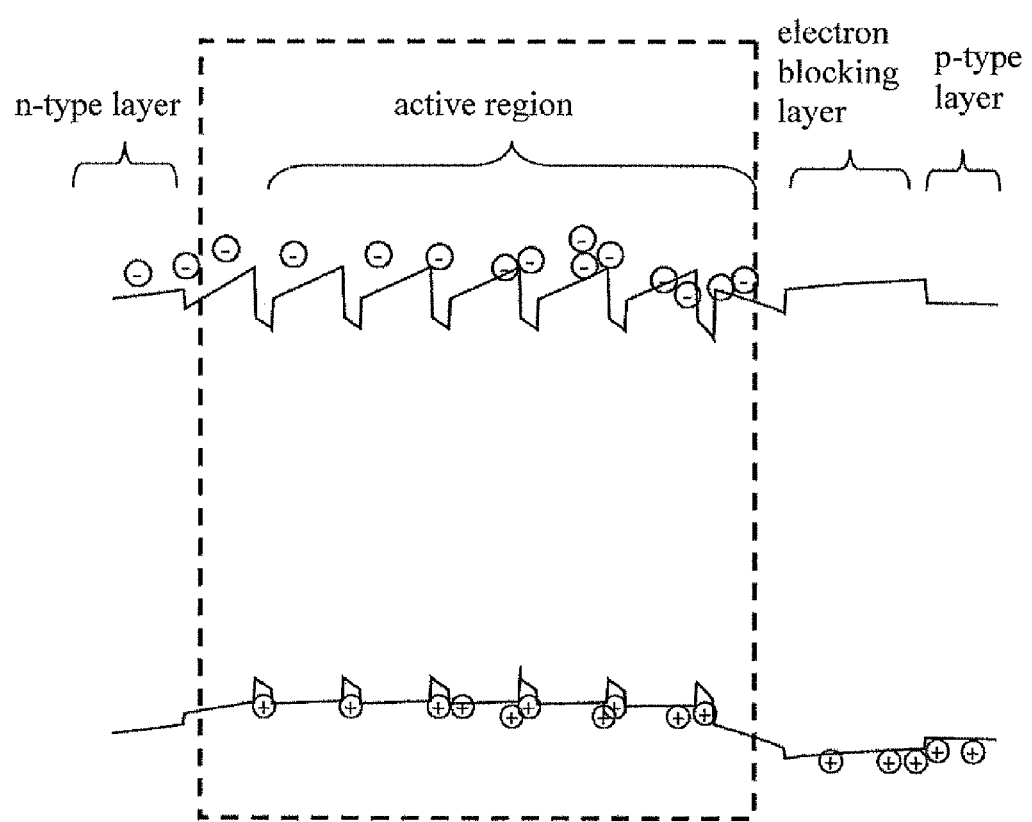
FIG. 4 is a diagram illustrating the band gap of wide band gap semiconductor light emitting device with graded composition hole tunneling layer and its influence on the behavior of carrier.

Then, please refer to FIG. 3 and FIG. 4. FIG. 3 is a diagram illustrating the band gap of conventional wide band gap semiconductor light emitting device and its influence on the behavior of carrier. FIG. 4 is a diagram illustrating the band gap of wide band gap semiconductor light emitting device with graded composition hole tunneling layer and its influence on the behavior of carrier. As shown in FIG. 3, more electron holes are accumulated near the electron blocking layer (right part in the Figure) in the active region. In the conventional wide band gap semiconductor light emitting device, because the composition of active layer is fixed, the distribution of electron holes will be over concentrated in a certain region, so that the transport ability of electron holes will be influenced.

On the contrary, in the embodiments of the present invention, as shown in FIG. 4, the conventional quantum-well with fixed composition is substituted by the graded composition hole tunneling layer, the distribution of electron holes will be averaged in every pair of indium gallium nitride (InGaN)/indium gallium aluminum nitride ($Al_xIn_yGa_{1-x-y}N$) in the graded composition hole tunneling layer. Except improving the distribution of electron holes in quantum-well (especially the last pair of indium gallium nitride (InGaN)/indium gallium aluminum nitride ($Al_xIn_yGa_{1-x-y}N$)) to increase the transport ability of electron holes effectively, the light emitting device with graded composition hole tunneling layer can also be operated under high current to further improve the transport of the carrier ability and the light emitting efficiency of the light emitting device. As shown in FIG. 4, the energy blocking layer of the above-mentioned is increased gradually from n-type semiconductor layer direction to p-type semiconductor layer direction, which means it is increased from left direction to right direction.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A light emitting device with graded composition hole tunneling layer and an energy blocking layer, wherein the graded composition hole tunneling layer comprises a plurality of pairs of indium gallium nitride (InGaN)/indium gallium aluminum nitride ($AlxInyGa_{1-x-y}N$), a thickness of the graded composition layer is about 3 nm to 15 nm, the energy blocking layer of the graded composition layer is increased gradually from an n-type semiconductor layer direction to a p-type semiconductor layer direction, the light emitting device is selected from the group consisting of a light emitting diode, a semiconductor laser and a laser diode, comprising:

a substrate, wherein the substrate is selected from the group consisting of zinc oxide (ZnO), silicon, spinel ($MgAl_2O_4$), gallium phosphide (GaP), germanium (Ge), lithium gallate (LGO, $LiGaO_2$) and glass material;

an n-type semiconductor layer disposed on the substrate, wherein the n-type semiconductor layer comprises a first portion and a second portion;

a graded composition hole tunneling layer disposed on the first portion of the n-type semiconductor layer, wherein the graded composition hole tunneling layer comprises a plurality of pairs of indium gallium nitride (InGaN)/indium gallium aluminum nitride ($AlxInyGa_{1-x-y}N$), wherein $0 \leq x \leq 0.5$, $0 \leq y \leq 0.5$, and x and y are selected from the group consisting of gradually increased and gradually decreased in indium gallium aluminum nitride ($AlxInyGa_{1-x-y}N$) for at least a pair of indium gallium nitride (InGaN)/indium gallium aluminum nitride ($AlxInyGa_{1-x-y}N$), wherein a content of aluminum and a content of indium in the indium gallium nitride (InGaN)/ indium gallium aluminum nitride ($Al_xIn_yGa_{1-x-y}N$) of a graded composition layer is selected from the group consisting of partially changed and totally changed, wherein the graded composition layer is selected from the group consisting of n-type doping graded composition layer and un-doping graded composition layer, a thickness of the graded composition layer is about 3 nm to 15 nm, wherein an energy blocking layer of the graded composition layer is increased gradually from an n-type semiconductor layer direction to a p-type semiconductor layer direction;

an electron blocking layer disposed on the graded composition hole tunneling layer, wherein the electron blocking layer is an indium gallium aluminum nitride ($Al_xIn_yGa_{1-x-y}N$) containing layer, and $0 \leq x \leq 0.5$, $0 \leq y \leq 0.5$;

a p-type semiconductor layer disposed on the electron blocking layer;

a first electrode disposed on the p-type semiconductor layer; and a second electrode disposed on the second portion of the n-type semiconductor layer and insulated from the first portion of the n-type semiconductor, wherein a charge of the second electrode and the first electrode is opposite.

* * * * *